United States Patent [19]

Schönberger et al.

[11] Patent Number: 5,253,144
[45] Date of Patent: Oct. 12, 1993

[54] DEVICE HOUSING HAVING AN INTEGRATED CIRCUIT BOARD

[75] Inventors: Eduard Schönberger; Hermann Kasowski, both of Amberg; Heinz Schmidt, Kümmersbruck, all of Fed. Rep. of Germany

[73] Assignee: Siemens Aktiengesellschaft, Berlin and Munich, Fed. Rep. of Germany

[21] Appl. No.: 925,884

[22] Filed: Aug. 6, 1992

Related U.S. Application Data

[63] Continuation of Ser. No. 725,576, Jul. 3, 1991, abandoned.

[30] Foreign Application Priority Data

Jul. 9, 1990 [EP] European Pat. Off. ........ 90113079.9

[51] Int. Cl.⁵ .............................................. H05K 7/20
[52] U.S. Cl. ..................... 361/736; 174/51; 361/703; 361/788; 439/76
[58] Field of Search ............... 211/41; 174/35 R, 51, 174/251, 252, 260; 165/80.3; 439/61, 62, 65, 76, 79, 80; 361/380–383, 386–389, 395, 399, 403, 412, 413, 415, 424

[56] References Cited

U.S. PATENT DOCUMENTS

| | | | |
|---|---|---|---|
| 2,904,768 | 9/1959 | Rasmussen | 339/17 |
| 2,999,997 | 9/1961 | Tuchel | 439/61 |
| 3,567,998 | 3/1971 | Ammerman | 361/413 |
| 3,774,080 | 11/1973 | Weidel | 361/396 |
| 4,107,760 | 8/1978 | Zimmer | 361/383 |
| 4,320,349 | 3/1982 | Freers | 330/66 |
| 4,509,647 | 4/1985 | Shevchuk | 211/41 |
| 4,628,410 | 12/1986 | Goodman | 361/413 |
| 4,823,233 | 4/1989 | Brown | 361/383 |
| 4,829,432 | 5/1989 | Hershberger | 361/424 |
| 4,862,326 | 8/1989 | Blomstedt | 361/413 |
| 5,057,968 | 10/1991 | Morrison | 361/385 |

FOREIGN PATENT DOCUMENTS 1045500 12/1958 France.
3222178 12/1983 France.
3732249 4/1989 France.

OTHER PUBLICATIONS

Siemens-Katalog Simatic S5, Automatisierungsgeräte (Automation Devices) S5-101 R and S5-105 R, Catalog ST 50, 1984.

Primary Examiner—Gerald P. Tolin
Attorney, Agent, or Firm—Kenyon & Kenyon

[57] ABSTRACT

Previously known circuit boards as components of devices having a housing have a plastic rear wall of the housing and the circuit board creates a connection between at least two printed circuit boards in the housing. Furthermore, processes for the production of three-dimensional printed circuits are known. Taking these as a point of departure, a one-piece circuit board as an integral portion of the housing of the device is created. One that not only produces the function of an electrically-conductive connection between the aforementioned printed circuit boards, but also serves as a mounting for the printed circuit boards, i.e., it can assume mechanical functions. This is solved by virtue of the fact that the rear wall (1) of the housing consists of plastic and embodies a circuit board having metallized strip conductors (2) and flat surfaces (3) that conduct electricity. And, on the interior of the rear wall (1), protruding connectors are moulded. The latter are themselves metallized, and they are, by dint of the strip conductors (2) and/or the flat surfaces (3), connected with one another so as to conduct electricity. The printed circuit boards (5) may be connected electrically to the connective media (4). Such circuit boards may be used in devices that provide automation.

6 Claims, 1 Drawing Sheet

DEVICE HOUSING HAVING AN INTEGRATED CIRCUIT BOARD

This application is a continuation of application Ser. No. 07/725,576, filed on Jul. 3, 1991 now abandoned.

BACKGROUND OF THE INVENTION

The invention relates generally to circuit boards that are components of a device with a housing, the rear wall of which consists of plastic, and more particularly to such a circuit board that creates a connection that conducts electricity between at least two printed circuit boards.

Circuit boards of the aforementioned type are well-known in conjunction with devices that provide automation, such as, for example, Type S5-105 R, as depicted in the Siemens Catalogue SIMATIC S5, automation devices S5-101 R and S5-105 R, Catalogue ST 50 1984. The aforementioned automation device consists of a housing with a transverse bus circuit board arranged toward the rear that is made of plastic bearing strip conductors and it exhibits female multipoint connectors facing toward the inside. Components having circuit boards can be inserted into the device's housing from the front. An exchange of data and signals between various connected components can occur by way of contact blades arranged along the back of the circuit boards that may be inserted into the female multipoint connectors, and via the transverse bus circuit board. Furthermore, the publication of the German patent application DE-32 22 178-A1, which was laid open for public inspection, teaches of an electrically insulating supporting plate to which, by means of the hot-stamping process, metallic conductors are affixed. In this case, using the supporting plate component, which consists of thermoplastic material, structural element receivers and connector elements are produced simultaneously. An additional publication, the German patent application DE-37 32 249-A1, which was laid open for public inspection, refers to a process for the production of three-dimensional circuit boards. The process described in this case makes it possible to produce strip conductors in the third dimension as well.

Taking circuit boards of the aforementioned type as a point of present invention is directed to the problem of creating a one-piece circuit board as an integral component of the device's housing which not only creates the function of a connection that conducts electricity between the aforementioned circuit boards, but can also assume mechanical functions. An integral component of the solution to this problem is the coordination of circuit boards and the acceptance and distribution of forces. In addition, by virtue of the circuit board, it is possible to attach devices.

SUMMARY OF THE INVENTION

The present invention solves this problem by constructing the rear wall of the housing so as to serve as a circuit board with metallized strips and flat surfaces that conduct electricity. Additionally, protruding connection points are injection moulded on the interior side of the rear wall, which points are themselves metallized and which points are connected with each other so as to conduct electricity by means of the strips and/or flat surfaces. Also, the circuit boards may be attached electrically, by means of plugs, to the connective means, which plugs may be affixed to the circuit board.

An advantageous embodiment occurs if the means of connection are metallized first pins and if, for the purpose of creating a plug-in connection with these first pins, provision is made for female multipoint connectors, which are connected both mechanically and electrically with the printed circuit boards. As a result of the distance between the first pins, which are molded on in the production process, a good degree of insulation is achieved in a simple manner.

An additional convenient connection to the circuit boards exists if the means of connection are embodied as a second set of metallized, adjacent pins in a configuration resembling springs, between which the circuit board may be extended to create a contact with its connective surfaces.

An additional simplification of the structure of the device is achieved by connecting one portion of the metallized strips and flat surfaces with a zero and/or shield potential for purposes of electromagnetic shielding.

Another advantageous embodiment occurs if the rear wall is constructed so as to be an attachment area, and if its external side is a metallized contact surface. A particularly simple embodiment for attachment to the ground for rearward attachment of the portion to be attached, the metallized contact surface may establish contact with a ground bar.

In order to improve the cooling of devices having such circuit boards, by means of which printed circuit boards are electrically connected with one another, it proves to be efficacious if cooling ribs that are metallized are molded along the rear wall. The result of such a measure is an enlarged heat-conducting surface by means of which waste heat generated in the course of operating the printed circuit boards or electronic components can be conducted to the outside air to a greater degree.

DETAILED DESCRIPTION

Figure 1:
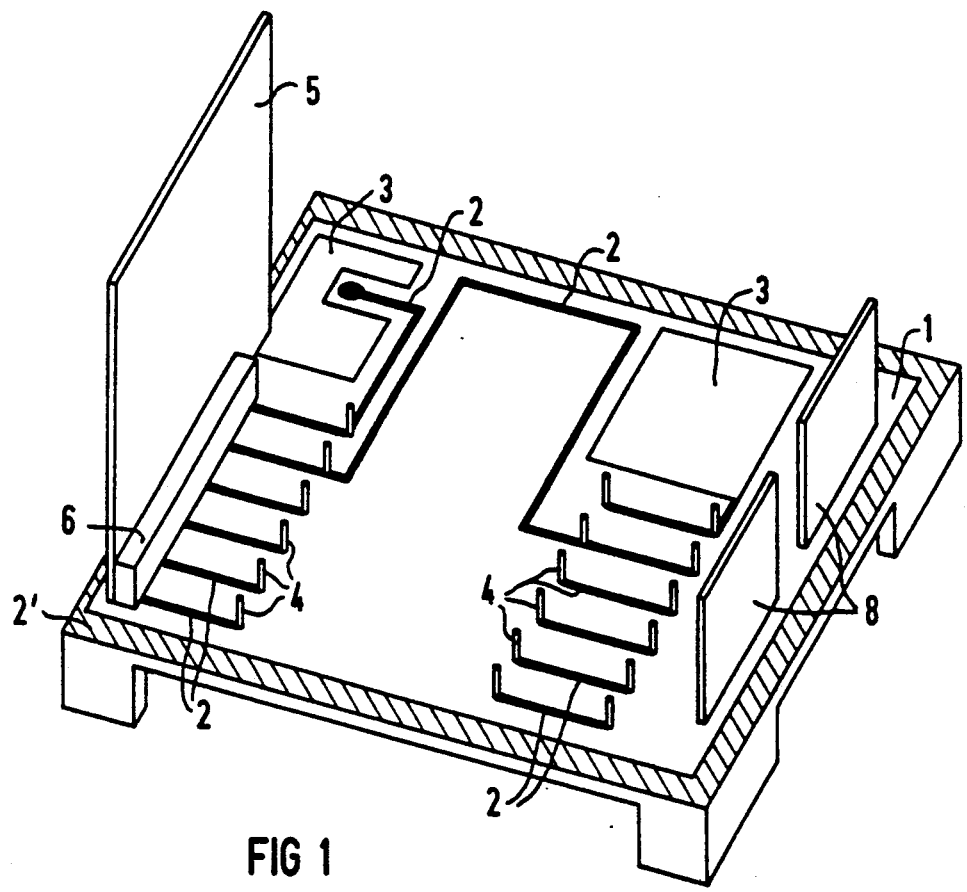
FIG. 1 shows a perspective view of a circuit board that serves as the rear wall of a housing.

In FIG. 1, a circuit board 1 is represented which, in addition to its electrical function by means of its connections in terms of wiring, also fulfills mechanical functions, i.e., in the example presented here it can serve at once as the rear wall and as a fastening segment of the housing of a device. To this end, the circuit board 1 exhibits a means of connection in the form of pins 4, which are moulded onto the circuit board 1 in the course of the production process. The circuit board 1 exhibits metallized flat surfaces 3 and strip conductors 2 which create an electrical connection between the pins 4 which are also metallized. Female multipoint connectors 6, which are mechanically and electrically connected with printed circuit boards 5, may be stuck onto the metallized pins. By way of example, only one printed circuit board is illustrated here. In this way, the exchange of electrical signals between various printed circuit boards 5 is possible by way of the pins 4 and the strip conductors 2. By way of the metallized flat surfaces 3, which are designed to be larger and to be capable of bearing a greater current, supplying current to printed circuit board 5 is possible. By way of a strip 2' that runs along the outer edge of the circuit board 1, which is electrically connected to the totally metallized exterior sides, shielding of the circuit may occur. Cooling ribs 8, as shown in FIG. 1, are also metallized. By means of said cooling ribs 8 better removal of the waste heat generated from the operation of printed circuit boards 5 or electronic components, is reached.

Figure 2:
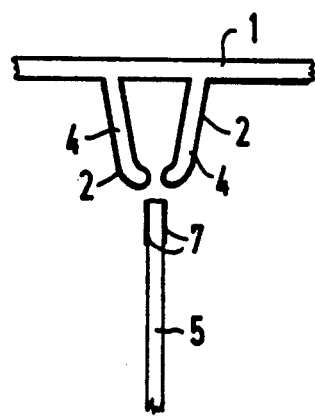
FIG. 2 shows a particular configuration of connective media on the circuit board intended for the insertion of a printed circuit board.

In FIG. 2 a segment of circuit board 1 is illustrated with special spring-like pins 4, which serve as a means of establishing a connection. The spring-like pins 4 are metallized and they are in an electrical connection with strip conductors 2. The particular arrangement and form of the pins 4 make it possible to establish contact of printed circuit boards 5 by inserting their electrical connective surfaces 7 in-between the pins 4.

Figure 3:
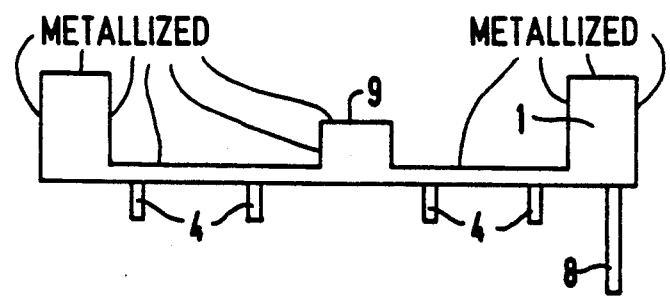
FIG. 3 shows a cross-section of the circuit board in keeping with FIG. 1 with the representation of a ground connection.

FIG. 3 shows circuit board 1, which serves as a rear wall, having a metallized contact surface 9 that comes into contact with the zero and shield potential by being pressed against a ground support that is attached toward the rear in attaching the rear wall.

Not only the rear wall, any other housing wall may be constructed to serve as a circuit board. In addition, by means of corresponding means of connection, it is possible to connect, electrically and mechanically, not only printed circuits 5, but also any other electrical structural elements one may wish. The circuit board described above is distinguished by its low cost in terms of material as well as assembly, and it entails corresponding savings in terms of costs.

What is claimed is:

1. A device housing receiving at least two printed circuit boards, said device housing being formed as one part and comprising:
    a rear wall having an interior side and made of plastic and serving as a backplane for electrically coupling printed circuit boards inserted in said housing;
    a plurality of metallized strip conductors coupled to the interior side of said rear wall;
    at least one metallized conducting surface having a greater surface area than each of the plurality of metallized strip conductors coupled to the interior side of said rear wall and at least one of said metallized strip conductors; and
    a plurality of metallized protruding connectors injection molded onto the interior side of said rear wall, said metallized protruding connectors coupled to said printed circuit boards and ones of said plurality of metallized strip conductors and at least one metallized conducting surface.

2. The device housing of claim 1, wherein said metallized protruding connectors comprise metallized pins and said printed circuit boards being electrically and mechanically coupled to a plurality of female multipoint connectors, such that said metallized pins are capable of being inserted into said female multipoint connectors as a plug-in connection.

3. The device housing of claim 1, wherein said metallized protruding connectors comprise adjacent pairs of metallized pins, each of said circuit boards comprises a connective surface such that insertion of one of said circuit boards between one said pairs of metallized pins causes electrical contact between the connective surface of said circuit board and said pair of metallized pins.

4. The device housing of claim 1, wherein at least one of said metallized strip conductors is capable of being coupled to at least one of a ground and a shield potential for electromagnetic shielding.

5. The device housing of claim 1, further comprising: a plurality of metallized cooling ribs molded onto the interior side of said rear wall.

6. The device housing of claim 1, wherein said rear wall includes a mounting part including a metallized contact surface, said metallized contact surface capable of being coupled to a ground support within said device housing.

* * * * *